US008680926B2

(12) United States Patent  (10) Patent No.: US 8,680,926 B2
Mucha et al.  (45) Date of Patent: Mar. 25, 2014

(54) AMPLIFICATION CIRCUIT COMPRISING INPUT SIGNAL LIMITING NETWORK

(75) Inventors: Igor Mucha, Bratislava (SK); Pavol Tikovič, Bratislava (SK); Marek Matej, Bratislava (SK)

(73) Assignee: Invensense, Inc., San Jose, CA (US)

( * ) Notice: Subject to any disclaimer, the term of this patent is extended or adjusted under 35 U.S.C. 154(b) by 102 days.

(21) Appl. No.: 13/461,446

(22) Filed: May 1, 2012

(65) Prior Publication Data

US 2013/0293297 A1  Nov. 7, 2013

(51) Int. Cl.
 *H03F 3/52* (2006.01)
(52) U.S. Cl.
 USPC ........................................ 330/298; 330/207 P
(58) Field of Classification Search
 USPC ................................. 330/298, 207 P, 250, 307
 See application file for complete search history.

(56) References Cited

U.S. PATENT DOCUMENTS

| 5,341,114 A * | 8/1994 | Calviello et al. ............. 333/17.2 |
| 6,900,698 B2 * | 5/2005 | Ikeda ............................. 330/298 |
| 2011/0026739 A1 | 2/2011 | Thomsen et al. |

* cited by examiner

*Primary Examiner* — Hieu Nguyen
(74) *Attorney, Agent, or Firm* — Maryam Imam; IPxLaw Group LLP

(57) ABSTRACT

The present invention relates to an integrated amplification circuit for a transducer signal comprising a semiconductor substrate. The semiconductor substrate comprises a signal limiting network comprising first and second parallel legs coupled between an input of a preamplifier and a first predetermined electric potential of the integrated amplification circuit. The first leg comprises a plurality of cascaded semiconductor diodes coupled to conduct current in a first direction through the limiting network and the second leg comprises a plurality of cascaded semiconductor diodes coupled to conduct current in a second direction through the limiting network. A current blocking member is configured to break a parasitic current path between an anode or a cathode of a semiconductor diode of the first leg or the second leg and the semiconductor substrate.

28 Claims, 7 Drawing Sheets

AMPLIFICATION CIRCUIT COMPRISING INPUT SIGNAL LIMITING NETWORK

The present invention relates to an integrated amplification circuit for a transducer signal comprising a semiconductor substrate. The semiconductor substrate comprises a signal limiting network comprising first and second parallel legs coupled between an input of a preamplifier and a first predetermined electric potential of the integrated amplification circuit. The first leg comprises a plurality of cascaded semiconductor diodes coupled to conduct current in a first direction through the limiting network and the second leg comprises a plurality of cascaded semiconductor diodes coupled to conduct current in a second direction through the limiting network. A current blocking member is configured to break a parasitic current path between an anode or a cathode of a semiconductor diode of the first leg or the second leg and the semiconductor substrate.

BACKGROUND OF THE INVENTION

Acceptable handling of transducer signals with large signal amplitude presents significant challenges to inputs of integrated amplification circuits, in particular for amplification circuits handling signals from a capacitive electret or condenser transducer element. A miniature ECM may comprise such a miniature capacitive electret or condenser transducer element to perform sound pick-up or recording in portable devices like mobile terminals, hearing instruments, headsets, sound recording cameras etc.

The large signal amplitude supplied by the transducer must be handled in a substantially linear manner by an input stage of a preamplifier up till a desired maximum amplitude. Above the desired maximum amplitude, the transducer signal must be limited to avoid irreversible damage to input devices of the preamplifier and/or other active or passive circuit components coupled to the input of the integrated amplification circuit. A known method of limiting the maximum amplitude of the input signal has been to place an input signal limiting network comprising a pair of anti-parallel diodes between the input of the preamplifier and ground, or any other suitable electric potential between the supply voltage and ground, such that input signal amplitudes exceeding about +/−one diode drop, typically +/−0.5-0.6 V, were limited to the latter peak level. However, this maximum amplitude level lies far below a maximum undistorted amplitude level delivered by contemporary miniature ECMs and other types of capacitive microphones. The low maximum amplitude handling capability of the input signal limiting network leads to premature distortion and audio signal clipping when utilized for microphone preamplifiers for capacitive microphones such as miniature ECMs. The premature distortion and audio signal clipping mean that an upper portion of a dynamic range of the capacitive microphones, e.g. sound pressure levels above 110, 120 or 130 dB SPL etc. depending on microphone sensitivity, is rendered useless.

It would accordingly be highly desirable to provide an input signal limiting network capable of handling maximum amplitudes well above the above-mentioned peak-peak level of about +/−0.5-0.6 V. The input signal limiting network should preferably be implementable in existing integrated semiconductor processes such as sub-micron CMOS and occupy a small semiconductor die area to keep costs low.

One possible methodology to increase the maximum input signal capability at the input of the preamplifier would be placing more than one diode, or other non-linear components, in series in each leg of the input signal limiting network. However, this is not feasible in standard semiconductor processes because any diffusion diode manufactured in a well suffers from a parasitic diode coupled between the well and the semiconductor substrate. Since the semiconductor substrate is coupled to ground, the parasitic diode creates a parasitic current path from the anode or cathode to ground when forward biased and spoils the intended operation of the semiconductor diode of the input signal limiting network for large input signal amplitudes e.g. above the previously mentioned peak-peak level of about +/−0.5-0.6 V. This problem has, however, been circumvented in accordance with the present invention where a current blocking member is configured to break the parasitic current path from an anode or cathode of the semiconductor diode to the semiconductor substrate.

One embodiment of the invention is based on the provision of a diode topology or design that comprises a current blocking member which creates a second parasitic diode in addition to the first parasitic diode towards the semiconductor substrate. This second, additional, parasitic diode is coupled in series with the first parasitic diodes and arranged to conduct forward in opposite direction to the first parasitic diode hence blocking any flow of parasitic current to or from the semiconductor substrate. This semiconductor diode topology is preferably based on a semiconductor process which offers an additional well diffusion compared to standard semiconductor processes.

Another embodiment of the invention is based on the provision of a diode topology or design that comprises a first poly-silicon member of a first polarity and second poly-silicon member of a second polarity arranged in electrical contact on top of a thick oxide layer opposite to the semiconductor substrate. The thick oxide layer functions as a current blocking member insulating both the cathode and anode terminals of the diode topology from the semiconductor substrate and accordingly prevents the creation of any parasitic diode current path to ground.

PRIOR ART

US 2011/0026739 A1 describes a dual-path microphone preamplifier structure comprising signal limiting network coupled to an input terminal of the amplification circuit. The signal limiting network comprises a pair of legs which each comprises between 2 and 5 cascaded diodes coupled in the same direction of forward conduction.

SUMMARY OF THE INVENTION

A first aspect of invention relates to an integrated amplification circuit for a transducer signal comprising a semiconductor substrate. The semiconductor substrate comprises a first polarity semiconductor material and the semiconductor substrate further comprises:
  a preamplifier comprising an input for receipt of the transducer signal,
  a signal limiting network comprising first and second parallel legs coupled between the input of the preamplifier and a first predetermined electric potential of the integrated amplification circuit. The first leg comprises a plurality of cascaded semiconductor diodes coupled to conduct current in a first direction through the limiting network and the second leg comprises a plurality of cascaded semiconductor diodes coupled to conduct current in a second direction through the limiting network. In accordance with the invention, a current blocking member is configured to break a parasitic current path between an anode or a cathode of a semiconductor diode of the first leg or the second leg and the semiconductor substrate.

The integrated amplification circuit may be designed as an ASIC, or included as a sub-circuit of an ASIC, fabricated in CMOS semiconductor processes such as analog, digital or mixed-signal sub-micron CMOS. The ASIC may comprise a plurality of additional circuits and components in addition to the integrated amplification circuit such as a charge pump, a controller or sequencer, a clock generator, an A/D converter etc. The integrated amplification circuit is preferably shaped and sized for placement inside a housing structure of transducer such as a miniature capacitive or condenser microphone. In this embodiment, the transducer signal may be generated by a capacitive transducer element electrically coupled to the input of the preamplifier.

The plurality of cascaded semiconductor diodes of the first leg are oriented or configured with the same direction of forward conduction and the plurality of cascaded semiconductor diodes of the second leg are configured with the same direction of forward conduction. However, the first direction of forward conduction through the first leg is opposite to the second direction of forward conduction through the second leg. Hence, each leg exclusively conducts current in one direction either for positive input signal amplitudes or for negative input signal amplitudes exceeding the sum of forward diode voltage drops of the plurality of cascaded semiconductor diodes of the leg in question. The skilled person will understand that the first and second legs may comprise the same number of cascaded semiconductor diodes or a different number of cascaded semiconductor diodes. The cascaded semiconductor diodes of each leg are preferably of same type e.g. simple diodes, poly-silicon diodes, diode-coupled MOS transistors or diode-coupled bipolar transistors etc.

Furthermore, if the first and second legs comprise the same number of cascaded semiconductor diodes of the same type, the maximum positive input signal amplitude may be substantially equal to the maximum negative input signal amplitude when signal limiting is activated to provide substantially symmetrical limiting of the input signal. The skilled person will understand that maximum positive and negative input signal amplitude before limiting can be adjusted or controlled by suitable selection of the number and type of cascaded semiconductor diodes of each of the first and second leg. The number of cascaded semiconductor diodes of each of the first and second legs is two or more such as between 2 and 20. In some embodiments, the maximum positive and negative input signal amplitude lies between +/−1.2 V-10 V. In this context, the maximum positive and negative input signal amplitude can be defined as the peak amplitude of the input signal at 1 kHz when the signal limiting network induces a total harmonic distortion of 10% into the input signal.

The signal limiting network is preferably DC coupled to the input of the preamplifier to set a DC bias point of the preamplifier. In this embodiment, the signal limiting network also functions as a bias network for the preamplifier. The signal limiting network may be connected to ground potential or to another suitable electric potential of the integrated amplification circuit such as a positive or negative DC reference voltage. Alternatively, the signal limiting network may be coupled to an input pad of the integrated amplification circuit and connected to the input of the preamplifier through a coupling capacitor such that the maximum peak input voltage is limited directly at the input of the integrated amplification circuit.

The current blocking member ensures that flow of current through a parasitic current path between the anode or cathode of at least one of the plurality of semiconductor diodes and the semiconductor substrate is suppressed or substantially eliminated. The parasitic current path often comprises one or more parasitic diodes coupled to an anode diffusion or a cathode diffusion of a semiconductor diode arranged in the semiconductor substrate. These parasitic diodes are coupled from the anode or cathode diffusion to the semiconductor substrate which typically is held at ground potential. Hence, the plurality of cascaded semiconductor diodes of the first or the second leg is coupled to ground via one or more parasitic diodes which therefore short circuit the plurality of cascaded semiconductor diodes. Consequently, the cascade of semiconductor diodes fails to provide the desired increase of peak input voltage handling capability unless the parasitic current path(s) are blocked or eliminated. Preferably, each semiconductor diode of at least one of the first and second legs comprises a current blocking member configured to break a parasitic current path between an anode or a cathode of the semiconductor diode and the semiconductor substrate. This embodiment maximizes the peak input voltage handling capability of the leg or legs in question by blocking all parasitic current paths.

One embodiment of the invention is based on a semiconductor process which offers an additional well diffusion compared to standard semiconductor processes. This embodiment comprises a semiconductor diode topology or design which comprises a second parasitic diode in addition to the above-discussed first parasitic diode formed between the anode or cathode of the semiconductor diode and the semiconductor substrate. This second, additional, parasitic diode is coupled in series with the first parasitic diode and arranged to conduct forward in opposite direction to the first parasitic diode. Hence, flow of parasitic current between the anode or cathode and the semiconductor substrate is blocked or disrupted. According to one such embodiment, a semiconductor diode of the first leg or the second leg comprises:

a first well diffusion of the first polarity forming part of an anode or cathode terminal of the semiconductor diode and surrounding a first diffusion of a second polarity forming an opposite terminal of the semiconductor diode, a second well diffusion of the second polarity surrounding the first well-diffusion and further surrounding a second diffusion of the second polarity arranged outside the first well diffusion to form the current blocking member, a first diffusion of the first polarity arranged in the semiconductor substrate outside the second well-diffusion.

As mentioned above, each semiconductor diode of the first leg and/or each semiconductor diode of the second leg may comprise a current blocking member.

The skilled person will understand that the first and second polarities will depend on the specific semiconductor process. Consequently, the first polarity may be p-type and the second polarity may be n-type such that the semiconductor substrate comprises a p-type semiconductor material, e.g. P−. Alternatively, the first polarity may be n-type and the second polarity may be p-type such that the semiconductor substrate comprises n-type semiconductor material, e.g. N−. A doping of the second diffusion of the second polarity is preferably higher than a doping of the second well diffusion of the second polarity. Likewise, a doping of the first diffusion of the first polarity is preferably higher than a doping of the first well diffusion of the first polarity.

Each semiconductor diode preferably comprises a second diffusion of the first polarity arranged inside the first well diffusion. Since the first well diffusion of the first polarity forms part of the anode or cathode terminal, the second diffusion of the first polarity may be used as electrical coupling point for a contact member establishing electrical connection from the anode or cathode terminal to other components (for example adjacent semiconductor diodes) of the signal limiting network by metal wire routing. A doping of the second diffusion of the first polarity is preferably higher than a doping of the first well diffusion of the first polarity.

The second diffusion of the second polarity may be electrically decoupled, i.e. floating, from the integrated amplification circuit which prevents that any parasitic current path is formed from the midpoint of the oppositely oriented first and second parasitic diodes to the semiconductor substrate. The second diffusion of the second polarity may alternatively be electrically connected to a third predetermined electrical potential that prevents latch-up through the first and second parasitic diodes.

A preferred embodiment of the invention provides a compact design or layout of the cascaded semiconductor diodes of the first and second legs in the semiconductor substrate. This embodiment preferably utilizes an adjacently arranged pair of semiconductor diodes where the semiconductor diodes of the pair circuit wise are arranged in different ones of the first and second legs of the signal limiting network. In this embodiment, each semiconductor diode of the first leg comprises:
  a first well diffusion of the first polarity forming part of an anode or cathode terminal of the semiconductor diode and surrounding a first diffusion of a second polarity forming an opposite terminal of the semiconductor diode,
  a second well diffusion of the second polarity surrounding the first well-diffusion and further surrounding a second diffusion of the second polarity arranged outside the first well diffusion to form the current blocking member,
  said second well diffusion being electrically connected to a predetermined electrical potential of the integrated amplification circuit through the second diffusion of the second polarity,
  a first diffusion of the first polarity arranged in the semiconductor substrate outside the second well-diffusion. Furthermore, each semiconductor diode of the second leg comprises a third well diffusion of the second polarity arranged in the semiconductor substrate and forming part of an anode or cathode terminal of the semiconductor diode and the third well diffusion is surrounding a second diffusion of the first polarity forming an opposite terminal of the semiconductor diode.

The first diffusion of the first polarity and the second diffusion of the second polarity are preferably connected to a ground potential of the integrated amplification circuit. The first diffusion of the first polarity may comprise a P+ type of diffusion if the polarity of the semiconductor material of the semiconductor substrate is P−. In this embodiment, the second diffusion of the second polarity preferably comprises N+ doped material such that N− doped material of the second N-well of the second polarity is electrically coupled to ground through the second diffusion of the second polarity. In the alternative, the second diffusion of the first polarity and the second diffusion of the second polarity may each be coupled to another predetermined electric potential of the integrated amplification circuit that prevents latch-up through the first and second parasitic diodes.

In a preferred embodiment, the second diffusion of the first polarity (GND) is arranged in-between the second well diffusion of the second polarity and the third well diffusion of the second polarity to provide a compact layout of the adjacently arranged pair of semiconductor diodes. This embodiment can be utilized for each pair of semiconductor diodes of the plurality of cascaded semiconductor diodes of the first and second legs to minimize die area consumption of the entire signal limiting network.

The first well diffusion of the first polarity, which forms part of the anode or cathode terminal of the semiconductor diode of the first leg, preferably comprises a second diffusion of the first polarity arranged inside the first well diffusion. The second diffusion of the first polarity may be used as electrical coupling interface for a contact member establishing electrical connection from the anode or cathode terminal of the semiconductor diode of the first leg to other components (for example adjacent semiconductor diodes) of the signal limiting network by metal wire routing. A doping of the second diffusion of the first polarity is preferably higher than a doping of the first well diffusion of the first polarity. Likewise, the third well diffusion of the second polarity, which forms part of the anode or cathode terminal of the semiconductor diode of the second leg, preferably comprises a third diffusion of the second polarity such that electrical coupling can be established to the anode or cathode terminal of the semiconductor diode in a similar manner.

According to yet another preferred embodiment of the invention, a semiconductor switch, preferably comprising a MOS transistor, is coupled across one or more of the plurality of cascaded semiconductor diodes of the first leg or a MOS transistor is coupled across one or more of the plurality of cascaded semiconductor diodes of the second leg. In this manner, drain and source terminals of the MOS transistor are coupled across the anode and cathode terminals of at least one semiconductor diode. Due to the low on-state impedance of the NMOS transistor it can essentially short circuit the semiconductor diode or diodes in question. The ability to selectively short circuit one or more of the semiconductor diodes of at least one of the first and second legs is highly useful in certain situations. The NMOS transistor may provide rapid settling of a DC input bias voltage at the microphone preamplifier input during powering-up of the integrated amplification circuit. This is useful because the signal limiting network may function as an extremely high impedance DC bias point setting network of the preamplifier input where the extremely high impedance ensures small or insignificant loading of the transducer. The reverse biased chains or cascades of semiconductor diodes may present an impedance larger than 1 G$\Omega$, or even larger than 10 G$\Omega$, under quiescent conditions at the input of the preamplifier. This impedance may lead to an unacceptable slow settling of DC operating points of the preamplifier in connection with start-up of the powering-up of the integrated amplification circuit as described in further detail below in connection with the appended drawings. In the present embodiment such start-up problems can be eliminated, or at least reduced, by switching the NMOS transistor to an on-state or conducting state during start-up of the microphone amplification circuit. Thereby, one or more of the plurality of cascaded semiconductor diodes are essentially bypassed by the low on-resistance of the cross-coupled MOS transistor such that the input of the preamplifier can be clamped to a desired electric potential through a low impedance path during start-up. Once, start-up of the microphone amplification circuit has been completed, the cross-coupled MOS transistor is switched to a non-conducting state or off-state such that the DC operating point is controlled by the impedance of one or more cascaded semiconductor diodes of the first or second legs.

In one embodiment, a plurality of semiconductor switches, preferably implemented as respective MOS transistors, is coupled across respective semiconductor diodes of the first leg and/or a plurality of semiconductor switches is coupled across respective semiconductor diodes of the second leg. In this embodiment, a cross-coupled MOS transistor may be arranged across each semiconductor diode of either the first leg or the second leg. In another embodiment a single semiconductor switch, e.g. a MOS transistor, may be cross-coupled across all semiconductor diodes of the first leg or across all semiconductor diodes of the second leg. The latter embodiment will require a higher drain source break-down voltage of the MOS transistor for a given maximum amplitude of the input signal at the preamplifier than the earlier mentioned embodiment using a plurality of MOS transistors.

In an advantageous embodiment of the above-mentioned MOS transistor or MOS transistors, the MOS transistor has been tightly integrated with one of the previously discussed semiconductor diodes by placing a source and drain diffusion of the MOS transistor inside the first well diffusion. The first well diffusion comprises the anode and cathode diffusions of the semiconductor diode. In this embodiment, the MOS transistor comprises:
- a third diffusion of the second polarity arranged within the first well to provide a first drain or source terminal of the MOS transistor. A gate terminal is formed above the first well in-between the third diffusion of the second polarity and the first diffusion of the second polarity. Thereby, the first diffusion of the second polarity forms both a second drain or source terminal of the MOS transistor and a cathode terminal of a first semiconductor diode of the plurality of cascaded semiconductor diodes. Hence, a compact layout of the MOS transistor and its associated semiconductor diode is provided.

In one embodiment, the third diffusion of the second polarity, forming the drain or source terminal of the MOS transistor, is electrically connected to the anode terminal of the first semiconductor diode while the third diffusion of the second polarity is connected to an anode or cathode terminal of another semiconductor diode of the plurality of cascaded semiconductor diodes of the same leg as the first semiconductor diode. In the latter embodiment, the MOS transistor may be cross-coupled across two or more of the plurality of cascaded semiconductor diodes of the same leg.

The skilled person will understand that each of the {first diffusion of the second polarity, second diffusion of the second polarity, third diffusion of the second polarity, first diffusion of the first polarity, second diffusion of the first polarity, third diffusion of the first polarity} preferably comprises an electrical contact member such as a metal contact connected thereto. In this manner, each of these diffusions can be electrically coupled to other components and electrical potentials of the integrated amplification circuit through appropriate wiring routing deposited on the semiconductor substrate.

As mentioned above, the semiconductor diode of the first leg or the second leg preferably comprises a diode selected from a group of {a diode-coupled bipolar transistor, a diode-coupled MOS transistor, a diode}.

Another embodiment of the invention is based on the provision of a diode topology or design that comprises a first poly-silicon member of a first polarity and second poly-silicon member of a second polarity arranged in electrical contact on a thick oxide layer. According to this embodiment, one or more of semiconductor diode(s) of the first leg and/or one or more of semiconductor diode(s) of the second leg comprises:
- a thick oxide layer deposited on an upper surface of the semiconductor substrate diffusion forming the current blocking member,
- a first poly-silicon member of a first polarity and second poly-silicon member of a second polarity arranged in electrical contact on top of the thick oxide layer opposite to the semiconductor substrate.

Preferably, each semiconductor diode of the plurality of cascaded semiconductor diodes of at least one of the first and second legs comprise the above-mentioned diode topology based on poly-silicon members. The first poly-silicon member comprises an anode structure or cathode structure of the semiconductor diode and the second poly-silicon member forms an opposite structure depending on the choice of the first and second polarities, i.e. either N+ or P+. In both instances, the thick oxide layer functions as a current blocking member insulating both the cathode and anode structure of the present diode topology from the semiconductor substrate. Accordingly, the thick oxide layer prevents the creation of any parasitic current path from the cathode and anode structures to the semiconductor substrate and therefore effectively shields the cascade of semiconductor diodes from being short-circuited to the semiconductor substrate at the large input signal amplitudes.

In one embodiment, the first poly-silicon member and the second poly-silicon member are adjacently arranged on the top of the thick oxide layer and abutted to each other to create the electrical contact. Hence, a diode junction is formed at the interface edges between the first and second poly-silicon members. In another embodiment, a third poly-silicon member is arranged in-between the first and second poly-silicon members. The third poly-silicon member may be of the first polarity or of the second polarity or without polarity. In the latter case, the third poly-silicon member comprises intrinsic poly-silicon or poly silicon without any doping. The third poly-silicon member is arranged in-between, and in abutment with, the first poly-silicon member and the second poly-silicon member to create the electrical contact. The third poly-silicon member preferably has a lower doping than a doping of the first or the second poly-silicon member for example without doping at all. A saturation current of the semiconductor diode can be adjusted by controlling a width of the third poly-silicon member allowing control and adaptation of the diode resistance to fit a particular application or semiconductor process.

The skilled person will appreciate that the semiconductor diode of the first leg and the semiconductor diodes of the second leg may be of different types such that at least one, and preferably each, semiconductor diode of the first or second leg comprises
- a first well diffusion of the first polarity forming part of an anode or cathode terminal of the semiconductor diode and surrounding a first diffusion of a second polarity forming an opposite terminal of the semiconductor diode,
- a second well diffusion of the second polarity surrounding the first well-diffusion and further surrounding a second diffusion of the second polarity arranged outside the first well diffusion to form the current blocking member,
- a first diffusion of the first polarity arranged in the semiconductor substrate outside the second well-diffusion. At least one, and preferably each, semiconductor diode of the other leg of the first or second legs comprises:
- a thick oxide layer deposited on an upper surface of the semiconductor substrate diffusion forming the current blocking member,
- a first poly-silicon member of a first polarity and second poly-silicon member of a second polarity arranged in electrical contact on top of the thick oxide layer opposite to the semiconductor substrate. Naturally, the above-discussed embodiments of each type of semiconductor diode may naturally be utilized in this hybrid-type of signal limiting network.

In one embodiment, the integrated amplification circuit comprises a DC bias voltage generator for supplying a DC bias voltage at a first externally accessible terminal. The DC bias voltage generator may comprise a charge pump to provide a higher bias voltage for a plate of a capacitive transducer element of a condenser microphone coupled to the first externally accessible terminal. A second externally accessible terminal of the integrated amplification circuit may be coupled to the input of the preamplifier such that the second externally accessible terminal could be coupled to another plate of the plate of a capacitive transducer element.

Another aspect of the invention relates to a capacitive or condenser microphone assembly comprising a capacitive transducer element having a back plate and a diaphragm arranged in a spaced relationship thereto. The diaphragm is displaceable relative to the back plate in response to sound. An integrated amplification circuit according to any of the above described embodiments thereof is electrically coupled to the capacitive transducer element such that at least one of the diaphragm and the back plate is electrically coupled to the input of the preamplifier to supply a microphone signal to the preamplifier. The capacitive or condenser microphone may comprise a miniature ECM (Electret Condenser Microphone) which is a particular kind of condenser microphone which comprises a permanently electrically charged electret layer. The charged electret layer provides DC bias voltage for a capacitive transducer element. Hence, the integrated amplification circuit is not required to deliver a DC bias voltage to the back plate or diaphragm of the miniature ECM and the microphone audio signal can be routed to the input of the preamplifier through a single pad of the integrated amplification circuit. In another embodiment, the capacitive transducer element may require the DC bias voltage to be supplied to the back plate or diaphragm to provide an electrical field between these structures. According to one embodiment, the condenser microphone assembly comprises a miniature MEMS condenser capsule enclosing the back plate and diaphragm. The miniature MEMS condenser capsule is preferably mounted on a carrier or substrate such as a printed circuit board or ceramics board for assembly for example by surface mount techniques. In the latter situation, the integrated amplification circuit may comprise the above mentioned first and second externally accessible terminals providing the DC bias voltage and the preamplifier input, respectively, for the back plate and diaphragm of the miniature MEMS condenser capsule.

BRIEF DESCRIPTION OF THE DRAWINGS

Embodiments of the invention will be described in more detail in connection with the append drawing in which.

DESCRIPTION OF PREFERRED EMBODIMENTS

Figure 1:
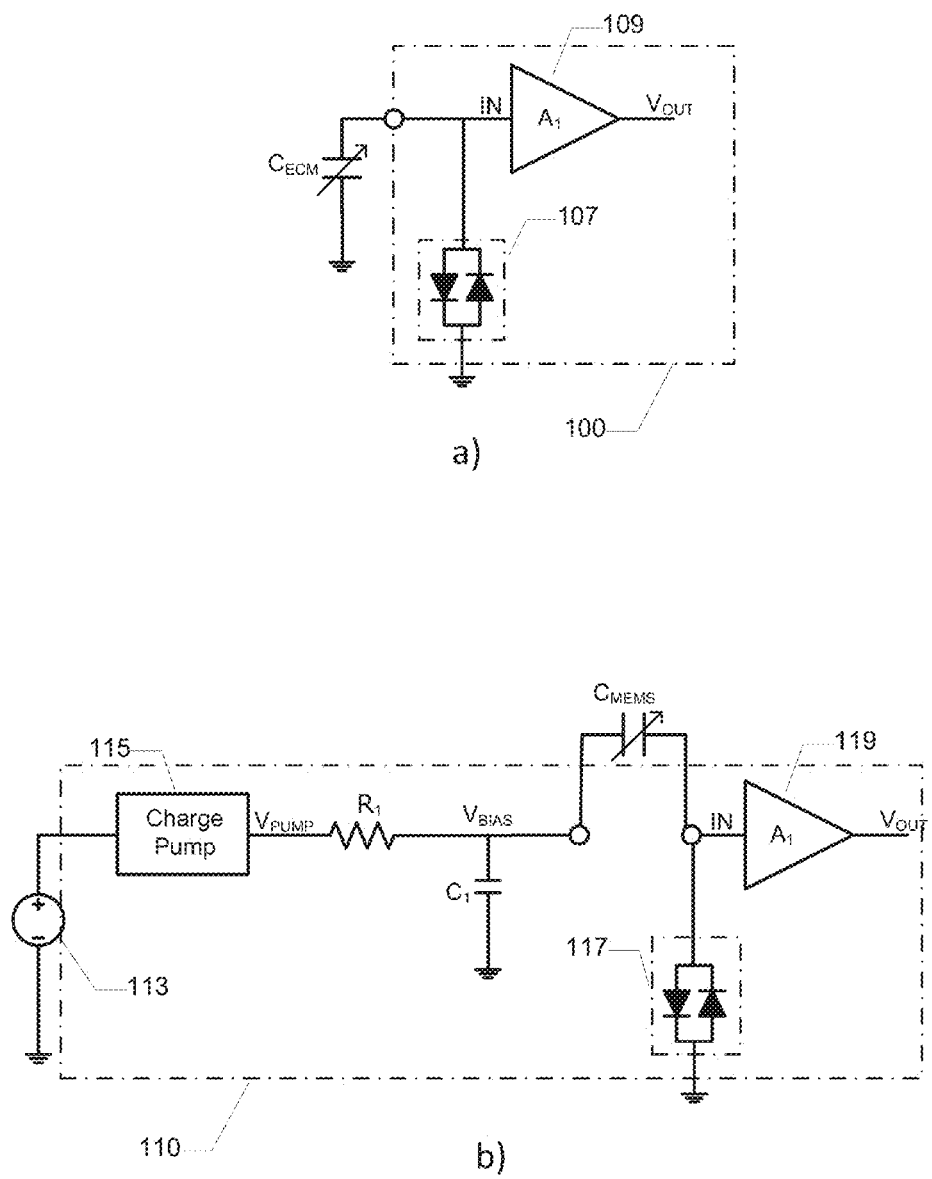
FIG. 1a) is a simplified schematic circuit diagram of a prior art microphone amplification circuit, comprising a DC bias network, coupled to a miniature ECM, FIG. 1b) is a simplified schematic circuit diagram of a prior art microphone amplification circuit, comprising a DC bias network, coupled to a miniature MEMS condenser microphone, FIG. 2a) is a simplified schematic circuit diagram of a prior art microphone amplification circuit and its associated input signal limiting network, FIG. 2b) is a substrate vertical cross-sectional view through a single diode of the cascaded semiconductor diodes of the input signal limiting network of the prior art microphone amplification circuit, FIG. 3a) is a simplified schematic circuit diagram of a microphone amplification circuit and its associated input signal limiting network in accordance with a first embodiment of the present invention, FIG. 3b) is a substrate vertical cross-sectional view through a single diode of the cascaded semiconductor diodes of the input signal limiting network of the microphone amplification circuit in accordance with the first embodiment of the invention, FIG. 4a) is a simplified schematic circuit diagram of a microphone amplification circuit and its associated input signal limiting network in accordance with a second embodiment of the present invention, FIG. 4b) is a substrate vertical cross-sectional view through a single diode of the cascaded semiconductor diodes of the input signal limiting network of the microphone amplification circuit of the second embodiment of the invention, FIG. 5a) is a simplified schematic circuit diagram of a microphone amplification circuit and its associated input signal limiting network in accordance with a third embodiment of the present invention, FIG. 5b) is a substrate vertical cross-sectional view through a single combined diode and MOS transistor structure of the cascaded semiconductor diodes of the input signal limiting network of the microphone amplification circuit in accordance with the third embodiment of the invention, FIG. 6a) is a simplified schematic circuit diagram of a microphone amplification circuit and its associated input signal limiting network in accordance with a fourth embodiment of the present invention, FIG. 6b) is a substrate vertical cross-sectional view through a single combined diode and MOS transistor structure of the cascaded semiconductor diodes of the input signal limiting network in accordance with the fourth embodiment of the invention, FIG. 7a) is a simplified schematic circuit diagram of a microphone amplification circuit and its associated input signal limiting network in accordance with a fifth embodiment of the present invention.

FIG. 1a) is a simplified schematic circuit diagram of a prior art microphone amplification circuit 100, comprising a DC bias network 107, coupled to a miniature ECM schematically illustrated as a variable capacitance, $C_{ECM}$, illustrating its change of capacitance in response to impinging sound. The miniature ECM (electret condenser microphone) is a particular kind of condenser microphone which comprises a permanently electrically charged electret layer which provides DC bias voltage for a capacitive transducer element (not shown) of the miniature ECM.

The amplification circuit comprises a preamplifier 109 having an input electrically coupled to the miniature ECM and to the DC bias network 107. The input impedance of the preamplifier 109 is often extremely large, for example tens of GΩ or higher, to avoid loading the miniature ECM and attenuate generated audio signals. The DC bias network 107 comprises a pair of anti-parallel diodes coupled between the input, IN, of the preamplifier 109 and ground such that the DC input bias voltage of the microphone preamplifier 109 is set close to a ground potential or any other suitable potential. The skilled person will understand that DC bias network 107 also operates as a signal limiting network such that input or audio signal amplitudes delivered by the miniature ECM exceeding about +/−one diode drop, typically +/−0.5-0.6 V, are limited to the latter peak level. As previously mentioned, this maximum amplitude level often lies far below the maximum undistorted amplitude level capability of the miniature ECM and therefore leads to premature distortion or audio signal clipping.

FIG. 1b) is a simplified schematic circuit diagram of another prior art microphone amplification circuit 110, comprising a DC bias network 117, coupled to a miniature Micro Electro Mechanical System (MEMS) fabricated condenser microphone. The MEMS condenser microphone is once again schematically illustrated as a variable capacitance, $C_{MEMS}$, illustrating its change of capacitance in response to impinging sound. The MEMS condenser microphone is a particular kind of condenser microphone which operates without the permanently charged electret layer of the above discussed ECM. Hence, the microphone amplification circuit 110 comprises a DC bias voltage circuit which may comprise a charge pump 115 or other type of DC-DC converter to generate the required DC bias voltage $V_{BIAS}$ for the capacitive transducer element. The charge pump 115 may be supplied with power from an external DC voltage source 113 such as a power supply rail or a battery voltage of an associated piece of electronic circuitry or equipment. The microphone amplification circuit 110 comprises an optional low-pass filter coupled between an output of the charge pump $V_{PUMP}$ and the DC bias voltage $V_{BIAS}$. The low-pass filter comprises a series resistor $R_1$ and a capacitor $C_1$ to ground. The microphone amplification circuit 110 comprises a microphone preamplifier 119 having a first externally accessible pad, IN, electrically coupled to one terminal of the MEMS condenser microphone $C_{MEMS}$. The first terminal is furthermore electrically coupled to a DC bias network 117 with characteristics similar to the above-discussed DC bias network 107.

Figure 2:
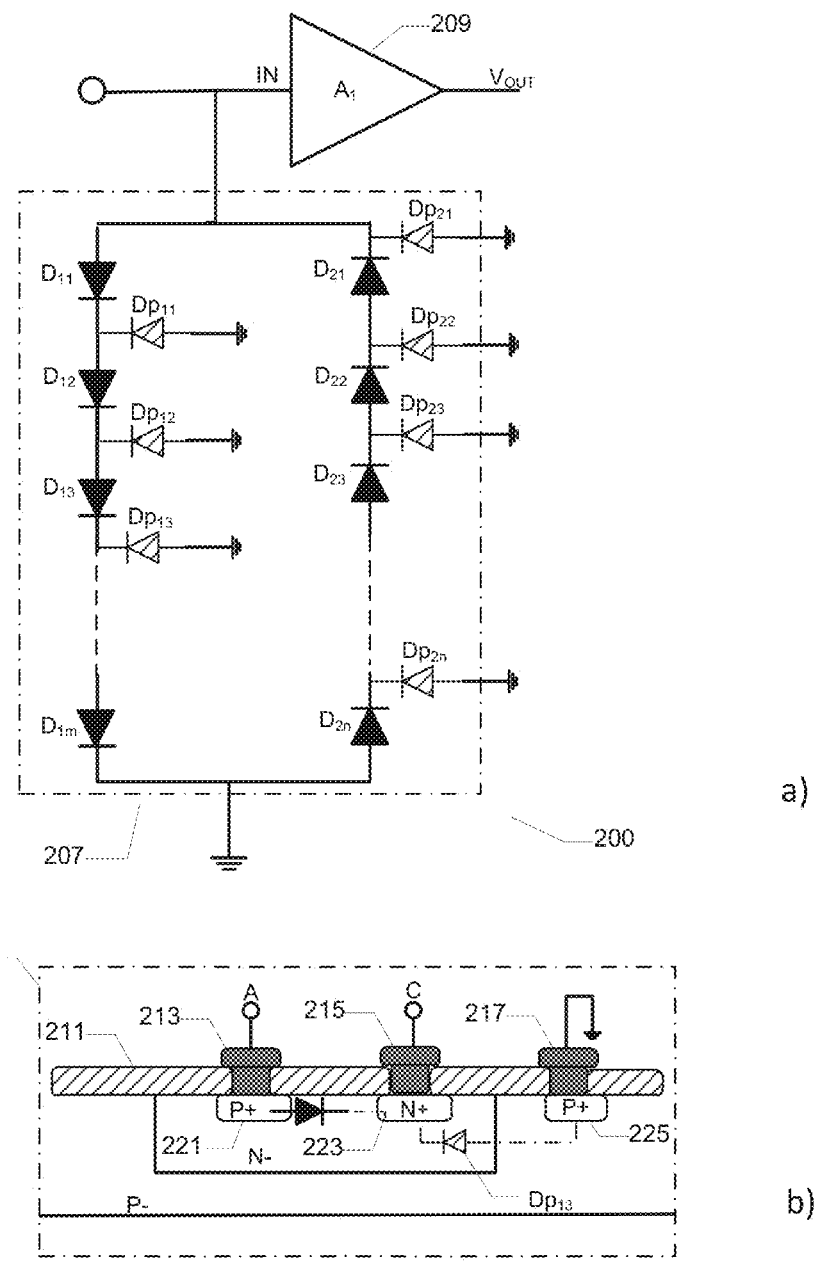

FIG. 2a) is a simplified schematic circuit diagram of a prior art microphone amplification circuit 200 and its associated signal limiting network 207. The signal limiting network 207 comprises first and second parallel legs coupled between the input IN of the preamplifier 209 and ground potential of the integrated amplification circuit. The first leg comprises a plurality of cascaded semiconductor diodes $D_{11}$-$D_{1m}$ coupled to conduct current in a first direction from IN to ground through the limiting network 207. The second leg also comprises a plurality of cascaded semiconductor diodes $D_{21}$-$D_{2n}$ but coupled to conduct current in a second direction, opposite to the first direction, from ground to IN. The intended purpose of this proposed design of the signal limiting network 207 is to increase its maximum amplitude handling capability from the previously mentioned level +/−0.5-0.6 V peak. However, each of the semiconductor diodes fabricated in the standard semiconductor process utilized for the design of the signal limiting network 207 and suffers from one of parasitic diode $D_{p11}$-$D_{p13}$ and $D_{p21}$-$D_{p2n}$ coupled to the semiconductor substrate which may be at ground potential (refer to layer P− in FIG. 2b)). The parasitic diodes are present because neither anode nor cathode of any of the semiconductor diodes $D_{11}$-$D_{1m}$ and $D_{21}$-$D_{2n}$ can be arranged in the semiconductor substrate as illustrated in FIG. 2b), because this would ultimately tie the opposite terminal of the semiconductor diode to ground. Hence, each of the parasitic diode $D_{p21}$-$D_{p23}$ creates a parasitic current path to ground when forward biased with a voltage above approximately 0.5 V which at least spoils the intended increase of maximum voltage handling capability of the second leg despite its cascade of semiconductor diodes $D_{21}$-$D_{2m}$.

FIG. 2b) is a vertical cross-sectional view through a single semiconductor diode, such as $D_{13}$, of the cascades of semiconductor diodes of the signal limiting network 207. The semiconductor diode such as $D_{13}$ comprises a N-well, N−, which is surrounded by a P minus or P− substrate. A field oxide layer 211 is deposited on top of an upper surface of the P− substrate in which the semiconductor diode $D_{13}$ is formed by conventional semiconductor process steps. The semiconductor diode $D_{13}$ is schematically indicated by the black diode symbol interconnecting a P+ anode diffusion 221 arranged adjacently to a cathode N+ diffusion 223 inside N− well. The P+ anode diffusion 221 is electrically connected to a contact 213 and the cathode N− well with N+ diffusion 223 is electrically connected to another contact 215 such that the anode and cathode can be electrically coupled to other components of the limiting network 207 by metal wire routing. The semiconductor diode $D_{13}$ further comprises another P+ diffusion 225 with an associated electrical contact member 217 which in combination provides a substrate ground connection for the P− substrate. However, in addition to the desired or designed semiconductor diode $D_{13}$ a parasitic diode $D_{p13}$ is formed between the cathode N+ diffusion 223 and the P− substrate with P+ diffusion 225 as illustrated by the hatched diode symbol. Likewise, another parasitic diode $D_{p21}$ is formed in addition to the intended or designed semiconductor diode $D_{21}$ in the second leg of the limiting network 207. Once this parasitic diode $D_{p21}$ becomes forward biased the input signal is clamped at one diode voltage drop below ground, i.e. typically minus 0.5-0.6 V, which spoils the desired increase of negative peak voltage handling capability of the second leg of the limiting network 207 where the plurality of cascaded semiconductor diodes $D_{21}$-$D_{2n}$ can sustain a much larger negative input voltage amplitude. A corresponding mechanism does not exist in the first leg wherein the top-most parasitic diode $D_{p11}$ is only coupled to a midpoint between the desired semiconductor diodes $D_{11}$-$D_{12}$. Hence, the parasitic diode $D_{p11}$ becomes backwards biased for positive input signal amplitudes above plus 0.5-0.6 V. However, the asymmetry in maximum amplitude handling of the input signal of the entire signal limiting network 207 leads to an asymmetric clipping or limiting of the audio or input signal of the preamplifier 209. This creates highly unpleasant audio signal distortion and tends to raise a DC voltage at the input, IN, of the preamplifier 209 from the intended DC voltage leading to an erroneous DC bias voltage across the capacitive transducer element (please refer to item $C_{MEMS}$ of FIG. 1b)).

Figure 3:
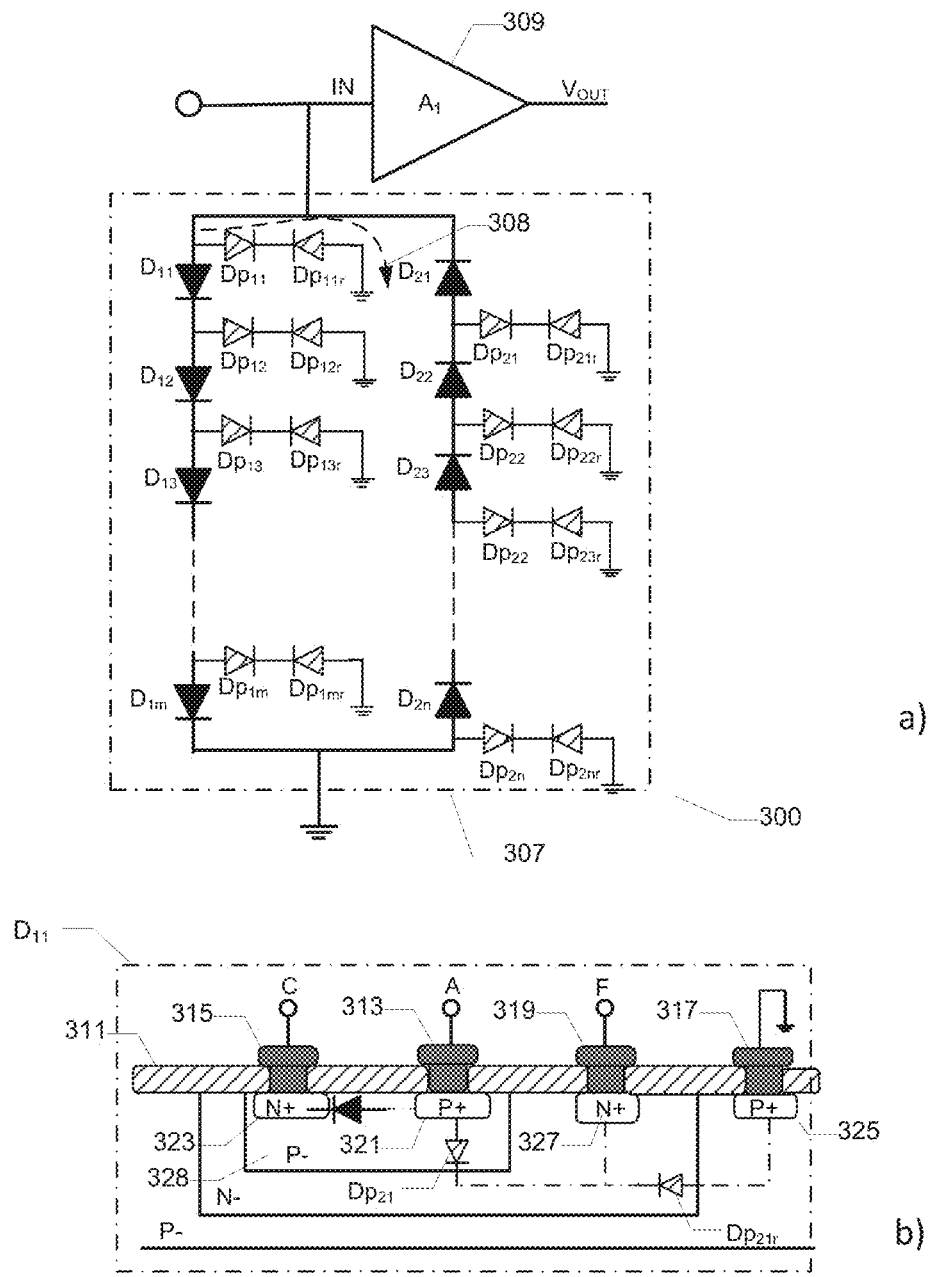

FIG. 3a) is a simplified schematic circuit diagram of a microphone amplification circuit 300 with a signal limiting network 307 in accordance with a first embodiment of the present invention. FIG. 3b) shows a substrate vertical cross-sectional view through a single semiconductor diode, such as $D_{11}$, of a plurality of cascaded semiconductor diodes $D_{11}$-$D_{1m}$ of a first leg of a signal limiting network 307. The signal limiting network 307 comprises first and second parallel legs coupled between the input IN of the preamplifier 309 (A1) and a ground electric potential of the integrated amplification circuit 300. The skilled person will understand that electrical characteristic of the preamplifier 309 may be similar to those of the preamplifier 209 discussed above. The microphone amplification circuit 300 is preferably fabricated in a sub-micron digital or mixed-signal CMOS process.

The first leg of the signal limiting network 307 comprises a plurality of cascaded semiconductor diodes $D_{11}$-$D_{1m}$ coupled to conduct current in a first direction from the input of the preamplifier 309 to ground. The second leg also comprises a plurality of cascaded semiconductor diodes $D_{21}$-$D_{2n}$ coupled to conduct current in a second, opposite, direction from ground to the input of the preamplifier 309. The skilled person will understand that the number of cascaded semiconductor diodes of the first leg may equal to, or different from, the number of cascaded semiconductor diodes of the second leg. The number of cascaded semiconductor diodes of each of the first and second legs is preferably equal or larger than two such as between 2 and 20 semiconductor diodes. By comparing the vertical cross-sectional views through the semiconductor diode topologies of FIG. 2b) and FIG. 3b), the skilled person can conclude that the semiconductor diodes of FIG. 2b) comprises P+ diffusion in the N− well. This diode topology has a parasitic diode from the N− well to the P− substrate. This leads to the formation of the parasitic current path in the second leg where the parasitic diode $Dp_{21}$ is coupled directly to the cathode of semiconductor diode $D_{21}$ and the input node IN. On the other hand, in the diode topology in accordance with the present invention depicted in FIG. 3b) the semiconductor diode $D_{11}$ comprises a N+ diffusion in the P− well 328. The semiconductor diode $D_{11}$ has a parasitic diode from the P− well 328 to the underlying N− well. The semiconductor diode $D_{11}$ has furthermore, an additional parasitic diode from the N− well to the P− substrate. Because of this difference of diode topology, the parasitic diodes $Dp_{11}$ and $Dp_{11r}$ associated with semiconductor diode $D_{11}$ of the first leg is coupled directly to the input IN of the preamplifier. Hence, while in FIG. 2b) the critical parasitic diode path which is evoked for large input signal amplitudes can be found in the second leg, the critical parasitic diode path is found in the first leg in FIG. 3b).

The present embodiment of the invention comprises current blocking members coupled to respective ones of the cascaded semiconductor diodes diodes $D_{11}$-$D_{1m}$ of the first leg and current blocking members coupled to respective ones of the semiconductor diodes $D_{21}$-$D_{2n}$ of the second leg. A first current blocking member is illustrated as the parasitic diode $Dp_{11r}$ of the first leg and a second current blocking member is illustrated as another parasitic diode $Dp_{21r}$ of the second leg of the signal limiting network 307 on FIG. 3a). The semiconductor topology of each of these parasitic diodes such as $D_{p11r}$ is illustrated below in FIG. 3b) and explained below in further detail. The parasitic diode $D_{p11r}$ is arranged in series with a second parasitic diode in form of $D_{p11}$. Since the forward current conduction direction of the parasitic diode $D_{p11r}$ is opposite to the series coupled second parasitic diode $D_{p11}$, a parasitic current path, illustrated by dotted arrow 308, between the anode of the semiconductor diode $D_{11}$ and the semiconductor substrate is broken or eliminated. Consequently, the second parasitic diode in form of $D_{p11}$ is never allowed to conduct parasitic current to the semiconductor substrate and clamp the input signal at a level one diode voltage drop below ground, i.e. typically minus 0.5-0.6 V, as discussed in connection with the corresponding situation in the signal limiting network 207 of FIG. 2. Furthermore, the other parasitic diodes $D_{p12r}$-$D_{p1mr}$ coupled in a similar manner to respective ones of the residual semiconductor diodes $D_{11}$-$D_{1m}$ of the second leg ensure that all corresponding parasitic current paths to the semiconductor substrate in the first leg are blocked or eliminated as well. Hence, in the present embodiment of the invention, the peak voltage handling capability of the first leg of the limiting network 307 corresponds largely to the sum of the forward diode voltage drops across of the semiconductor diodes $D_{11}$-$D_{1m}$. Likewise, the peak voltage handling capability of the second leg of the limiting network 307 corresponds largely to the sum of the forward diode voltage drops across of the semiconductor diodes $D_{21}$-$D_{2n}$. Consequently, the peak voltage handling capability for both positive and negative input signal amplitudes of the input signal at the preamplifier input may be adjusted in a flexible manner to any desired value(s) by selecting the number of cascaded semiconductor diodes, and possibly type of semiconductor diodes, in each of the first and second legs of the limiting network 307.

FIG. 3b) is a vertical cross-sectional view through a single semiconductor diode, such as $D_{11}$, of the plurality of semiconductor diodes of the signal limiting network 307. The semiconductor diode $D_{11}$ is arranged inside a P-well diffusion 328 (P−) which is surrounded by a N-well diffusion, N−. The N-well diffusion is arranged within a P-type semiconductor substrate, P−. A field oxide layer 311 is deposited on top of an upper surface of the P− substrate in which the semiconductor diode $D_{11}$ is embedded by appropriate semiconductor process steps. The semiconductor diode $D_{11}$ is schematically indicated by a black diode symbol interconnecting a P+ diffusion 321 functioning as a well-contact for an anode of the semiconductor diode $D_{11}$ comprising the P− well diffusion 328. Inside the P− well diffusion a diode cathode N+ diffusion 323 is arranged adjacently to the P+ diffusion 321. The anode of the semiconductor diode $D_{11}$ accordingly comprises the P− well 328 together with the P+ diffusion 321 and is electrically connected to a contact 313. The cathode of the semiconductor diode $D_{11}$ formed by the N+ diffusion 323 is electrically connected to another contact 315 such that the anode and cathode can be electrically coupled to other components of the limiting network 307 through appropriate wiring routing deposited on the upper surface of the semiconductor die or substrate P−. The semiconductor diode $D_{11}$ further comprises another P+ diffusion 325 with an associated electrical contact member 317 which in combination provides a substrate ground connection for the P− substrate similar to the design depicted in FIG. 2b) above. The N− well further surrounds a second N+ diffusion 327 which is arranged outside the P-well 328 whereby the first parasitic diode $D_{p11}$ is formed between the P− well and the N− well with the orientation indicated by the hatched diode symbol. As previously mentioned, a second parasitic diode $D_{p11r}$ is formed in series with the first parasitic diode between the P− substrate and the N− well with a resulting orientation of forward conduction as indicated by the illustrated hatched diode symbol. An interconnect node between the first and second parasitic diodes $D_{p11}$, $D_{p11r}$ is coupled to the second N+ diffusion 327. The second N+ diffusion 327 comprises an electrical contact member 319 which may be left decoupled or floating or unconnected, or it may be connected to a suitable potential to prevent a latch-up sensitive node. Hence, the formation of the first parasitic diode $D_{p11}$, which is enabled by the formation of the additional P-well 328 compared to the standard semiconductor process depicted in FIG. 2b), provides a current blocking member disrupting current conduction from the anode, i.e. the P− well 328 together with the P+ diffusion 321, of the semiconductor diode $D_{11}$ through the parasitic current path 308 to the semiconductor substrate P−.

Figure 4:
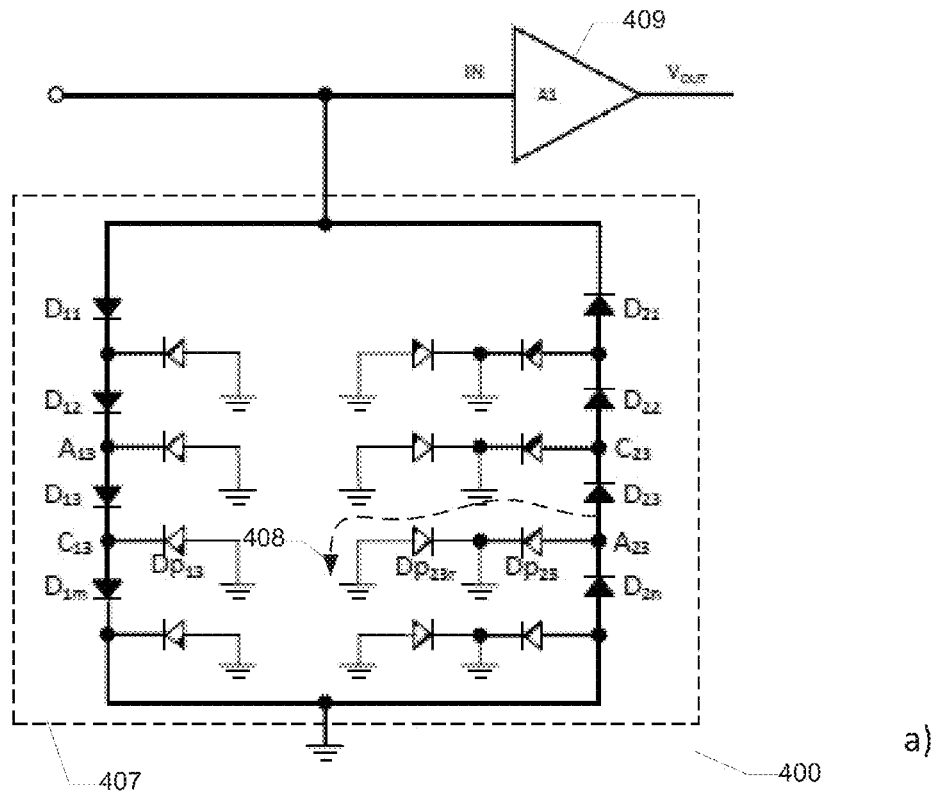
Figure 4:
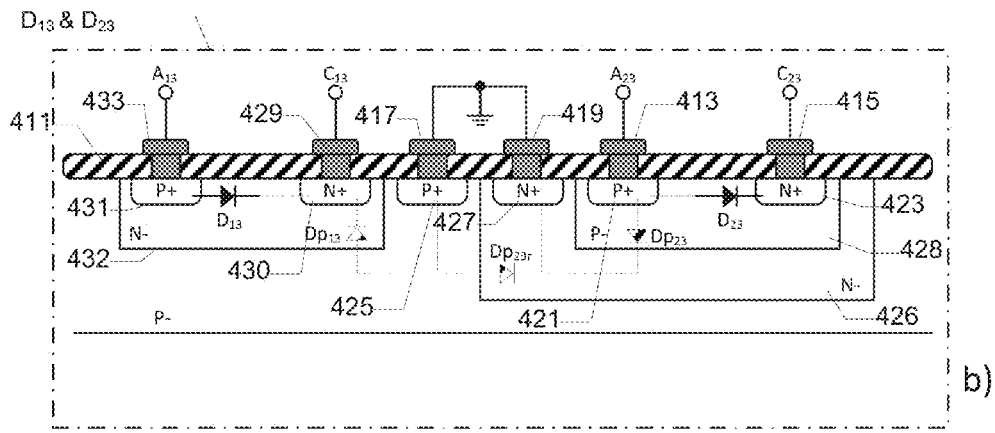

FIG. 4a) is a simplified schematic circuit diagram of a microphone amplification circuit 400 with a signal limiting network 407 in accordance with a second embodiment of the present invention. FIG. 4b) shows a substrate vertical cross-sectional view through an adjacently arranged pair of semiconductor diodes. The semiconductor diodes are circuit wise arranged in different legs of the signal limiting network 407.

The semiconductor diode $D_{23}$ is arranged in the second leg and the semiconductor diode $D_{13}$ is arranged in the first leg. The proximate physical location of this pair of semiconductor diodes provides a compact circuit layout. In comparison to the topology of the semiconductor diodes in the above described first embodiment of the invention, the respective parasitic diodes associated with $D_{23}$ and $D_{13}$ exhibit an asymmetric device topology. A pair of reversely oriented parasitic diodes $D_{p21r}$, $D_{p21}$ is coupled to the anode of $D_{23}$ of the second leg of the signal limiting network 407. A corresponding pair of reversely oriented parasitic diodes is coupled to the anode of each of the residual semiconductor diodes of the second leg. This topology is similar to the above discussed topology of the semiconductor diode $D_{21}$ in the first embodiment of the invention and shows corresponding parasitic current path blocking characteristics. However, in the first leg only a single parasitic diode $D_{p13}$ is coupled from the cathode of $D_{13}$ to the semiconductor substrate P−. As previously explained in connection with FIG. 2a), this topology is sufficient to block parasitic current path through the first leg because parasitic diode $D_{p13}$ and the other illustrated parasitic diodes of the first leg are shielded by or behind the first semiconductor diode $D_{11}$. Hence, only a single leg of the first and second legs needs current blocking members to prevent short-circuiting of the associated cascade of semiconductor diodes.

FIG. 4b) is a substrate vertical cross-sectional view through the adjacently arranged pair of semiconductor diodes $D_{13}$ and $D_{23}$ of the first and second legs, respectively, of the signal limiting network 407. The semiconductor diode $D_{23}$ is arranged inside a P-well diffusion 428 (P−) which is surrounded by a N-well diffusion 426 (N−). The N-well 426 is arranged in a P− type semiconductor substrate, P−. A field oxide layer 411 is deposited on top of an upper surface of the P− substrate in which the semiconductor diode $D_{23}$ is embedded by appropriate semiconductor process steps. The semiconductor diode $D_{23}$ of the second leg is schematically indicated by a black diode symbol interconnecting a P+ diffusion 421 of the semiconductor diode $D_{21}$ and an adjacently arranged cathode N+ diffusion 423 inside P− well 428. The P− well 428 together with P+ diffusion 421 form an anode of the semiconductor diode $D_{23}$ and is electrically connected to a contact 413. The cathode of the semiconductor diode $D_{23}$, formed by the N+ diffusion 423, is electrically connected to another contact 415 such that the anode and cathode can be electrically coupled to other components of the limiting network 407 through appropriate wiring routing deposited on the upper surface of the semiconductor die or substrate P−. The semiconductor diode $D_{23}$ further comprises another P+ diffusion 425 with an associated electrical contact member 417 which in combination provides a substrate ground connection for the P− substrate similar to the design depicted in FIG. 3b) above. The N-well 426 further surrounds a second N+ diffusion 427 which is arranged outside the P-well 428. In this manner, the first parasitic diode $D_{p23}$ is formed between the P-well 428 and the N-well 426 with the forward conduction orientation indicated by the hatched diode symbol. As previously mentioned, a second parasitic diode $D_{p23r}$ is formed in series with the first parasitic diode between the P− substrate and the N-well 426 with the orientation of forward current conduction indicated by the hatched diode symbol. An interconnect node between the first and second parasitic diodes $D_{p21}$, $D_{p21r}$ is coupled to the second N+ diffusion 427. The second N+ diffusion 427 comprises an electrical contact member 419 which preferably is coupled ground as indicated. Hence, the second N+ diffusion 427 comprises a ground connection for the N-well 426 in the present embodiment of the invention. In the alternative, the second N+ diffusion 427 may be coupled to another predetermined electric potential of the microphone amplification circuit 400 that prevents latch-up through the first and second parasitic diodes $D_{p21}$, $D_{p21r}$.

The semiconductor diode $D_{13}$ of the first leg is schematically indicated by another black diode symbol interconnecting a P+ diffusion 431 and an adjacently arranged cathode N+ diffusion 430 inside N− well 432 of the semiconductor diode $D_{13}$. The P+ diffusion 431 and cathode N+ diffusion 430 are surrounded by a second N-well 432 embedded in the P-type semiconductor substrate P− adjacent to the P+ diffusion 425. The parasitic diode $D_{p13}$ is formed between the cathode N+ diffusion 430 inside the N− well 432 and the P− substrate with the forward current conduction orientation indicated by the hatched diode symbol. The P+ diffusion 431 is electrically connected to a contact 433 and the N+ diffusion 430 together with N− well 432 is electrically connected to another contact 429 such that the anode and cathode can be electrically coupled to other components of the limiting network 407 in accordance with the schematic diagram of FIG. 4a) through appropriate wiring routing deposited on the upper surface of the semiconductor die or substrate P−.

Figure 5:
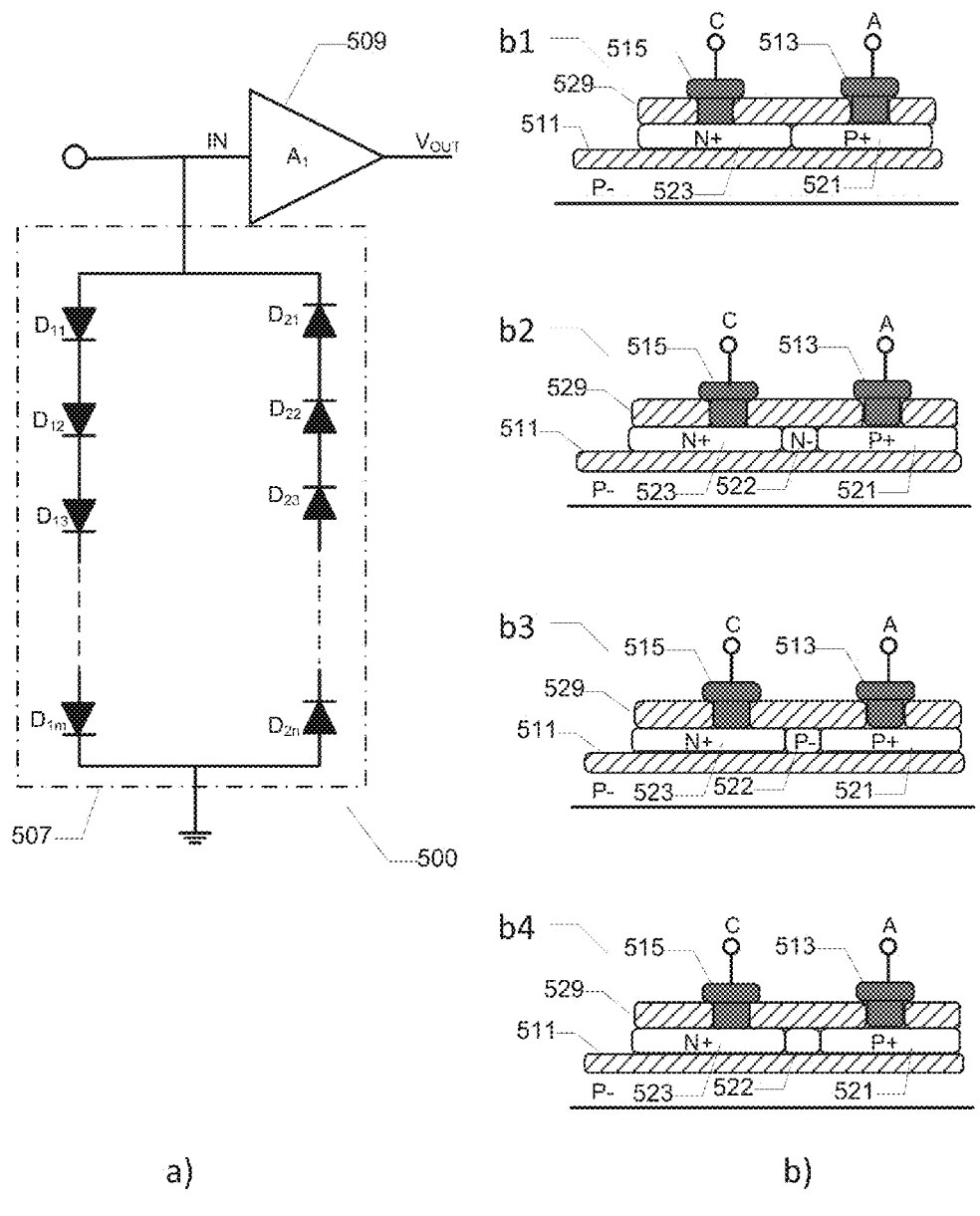

FIG. 5a) is a simplified schematic circuit diagram of a microphone amplification circuit 500 with a signal limiting network 507 in accordance with a third embodiment of the present invention. The signal limiting network 507 comprises first and second parallel legs coupled between an input IN of the preamplifier 509 (A1) and a ground electric potential of the integrated amplification circuit 500. The first leg comprises a plurality of cascaded semiconductor diodes $D_{11}$-$D_{1m}$ and the second leg comprises a plurality of cascaded semiconductor diodes $D_{21}$-$D_{2n}$. The skilled person will understand that electrical characteristics of the preamplifier 509 may be similar to those of the preamplifier 209 discussed above. The microphone amplification circuit 500 is preferably fabricated in a sub-micron analog, digital or mixed-signal CMOS process. The plurality of cascaded semiconductor diodes diodes $D_{11}$-$D_{1m}$ of the first leg are coupled to conduct current in a first direction from the input of the preamplifier 509 to ground. The plurality of cascaded semiconductor diodes $D_{21}$-$D_{2n}$ are coupled to conduct current in a second, opposite, direction from ground to the input of the preamplifier 509. The skilled person will understand that the number of cascaded semiconductor diodes of the first leg may equal to, or different from, the number of cascaded semiconductor diodes of the second leg. The number of cascaded semiconductor diodes of each of the first and second legs is preferably between 2 and 20 such as between 5 and 10.

FIG. 5b) shows three different embodiments of a single semiconductor diode, such as $D_{21}$, in substrate vertical cross-sectional view in drawings b1, b2, b3 and b4. The skilled person will understand that all semiconductor diodes $D_{11}$-$D_{1m}$ and diodes $D_{21}$-$D_{2n}$ may be of the same embodiment or may be of different embodiments. The four different embodiments of the semiconductor diodes $D_{11}$-$D_{1m}$ and diodes $D_{21}$-$D_{2n}$ depicted on drawings b1, b2, b3 and b4 share a common feature in that the semiconductor diodes are implemented in a poly-silicon layer of the semiconductor process. The semiconductor diode, such as $D_{21}$, embodiment illustrated on drawing b1 lies above a semiconductor substrate P−. A field or thick oxide layer 511 is deposited on an upper surface of the semiconductor substrate P−. A first poly-silicon member 523 of N+ polarity and second poly-silicon member 521 of P+ polarity are arranged in abutment on the top of the thick oxide layer 511 on an opposing surface relative to the semiconductor substrate. The junction where the first poly-silicon member 523 and the second poly-silicon member 521 are abutted creates an electrical contact between these members such that a diode junction or effect is created. The first poly-silicon member 523 of N+ polarity forms a cathode of the semiconductor diode and the second poly-silicon member 521 of P+ polarity forms an anode of the semiconductor diode. The P+ anode member 521 is electrically connected to a contact 513 through an opening in a second oxide layer 529 and the N+ cathode member 523 is similarly electrically connected to another contact 515 through a second opening in the second oxide layer 529 such that the anode and cathode can be electrically coupled to other components of the limiting network 507 in accordance with the schematic diagram of FIG. 5a) through appropriate wiring routing deposited on the upper surface of the semiconductor die or substrate P−. The field or thick oxide layer 511 deposited on the upper surface of the semi-conductor substrate P− is electrically insulating which prevents any formation of parasitic diodes from the P+ anode member 521 to the semiconductor substrate P−. Likewise, the field or thick oxide layer 511 prevents any formation of parasitic diodes from the N+ cathode member 523 to the semiconductor substrate P−. Hence, the thick oxide layer 511 serves as a current blocking member that break a parasitic current path between each of the P+ anode member 521 and N+ cathode member 523 of the semiconductor diode $D_{21}$ and the semiconductor substrate P−.

The semiconductor diode, such as $D_{21}$, embodiments illustrated on respective ones of drawings b2, b3 and b4 are also arranged on top of the semiconductor substrate P−. The characteristics discussed above in connection with the semiconductor diode embodiment on drawing b1 also applies to the present second and third embodiments and corresponding features have been supplied with identical reference numerals to ease comparison. The semiconductor diode, such as $D_{21}$, embodiment illustrated on drawings b2, b3 and b4 comprises a third poly-silicon member 522 arranged in-between, and in abutment with, the P+ anode member 521 and N+ cathode member 523 of the semiconductor diode $D_{21}$. The third poly-silicon member 522 may have a N-type of doping which is lower than the N-type doping of the N+ cathode member 523 as illustrated in the embodiment on drawing b2. Alternatively, the third poly-silicon member 522 may have a P-type of doping which is lower than the P-type doping of the P+ anode member 521 as illustrated in the embodiment on drawing b3. In yet another alternative, the third poly-silicon member 522 may have no doping; i.e. formed by intrinsic poly-silicon, as illustrated in the embodiment on drawing b4. The depicted variants of the third poly-silicon member 522 may lead to different saturation currents of the semiconductor diode $D_{21}$. This will result in different equivalent resistances, noise, etc. such that the choice of diode variant can be tailored to particular process technology.

Figure 6:
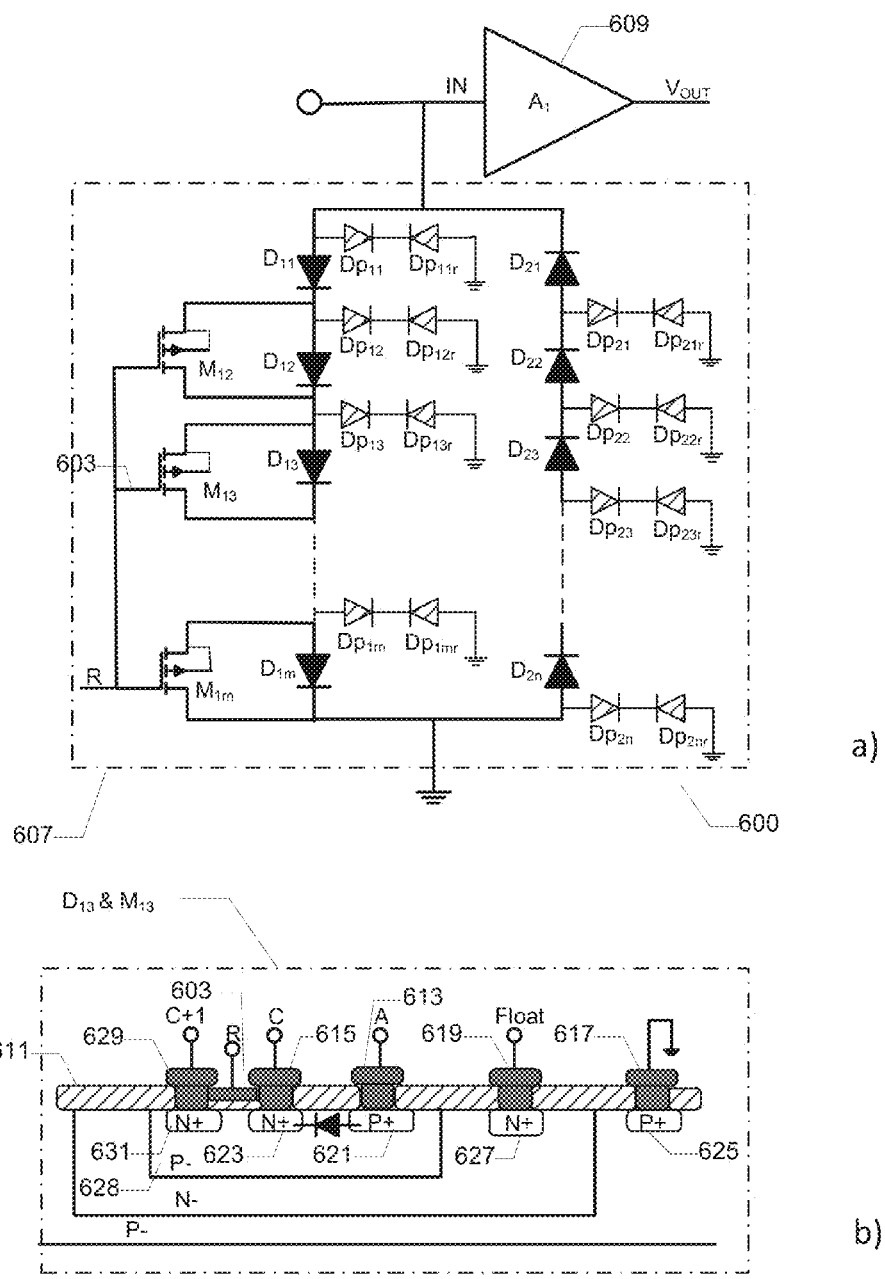

FIG. 6a) is a simplified schematic circuit diagram of a microphone amplification circuit 600 with a signal limiting network 607 in accordance with a fourth embodiment of the present invention. The signal limiting network 607 comprises first and second parallel legs coupled between an input IN of the preamplifier 609 (A1) and a ground electric potential of the integrated amplification circuit 600. The first leg comprises a plurality of cascaded semiconductor diodes $D_{11}$-$D_{1m}$ and the second leg comprises a plurality of cascaded semiconductor diodes $D_{21}$-$D_{2n}$. The skilled person will understand that electrical characteristic of the preamplifier 609 may be similar to those of the preamplifier 209 discussed above. The characteristics of the signal limiting network 307 discussed above in connection with the microphone amplification circuit 300 of the first embodiment of the invention also applies to the present embodiment. Corresponding features of the first embodiment of the invention and the present embodiment have been supplied with identical reference numerals to ease comparison. The present microphone amplification circuit 600 comprises a plurality of semiconductor switches comprising respective NMOS transistors $M_{12}$-$M_{1m}$ that are coupled across respective ones of the plurality of cascaded semiconductor diodes $D_{12}$-$D_{1m}$ of the first leg of the signal limiting network 607. The skilled person will understand that the second leg of the signal limiting network 607 may comprise a corresponding arrangement of semiconductor switches in other embodiments of the invention. The purpose of the NMOS transistors $M_{12}$-$M_{1m}$ is to facilitate rapid settling of the DC input bias voltage at the microphone preamplifier input IN during powering-up of the microphone amplification circuit 600. As previously mentioned, the signal limiting network 607 also functions as a DC bias point setting network of the microphone amplification circuit 600 where the extremely high impedance of the signal limiting network 607 under quiescent conditions, or conditions where the input signal level lies far below the limiting voltage of the network, ensures that loading of the capacitive microphone element is small. However, when abrupt voltage changes are required at the input of the preamplifier 609, such as during pre-charging of the capacitive microphone element or during start-up of the microphone amplification circuit 600, the extremely high impedance of the signal limiting network 607 results in drift of the DC operating points of the preamplifier 609. The extremely high impedance of the signal limiting network 607 causes an undesired slow subsequent settling of the input of the preamplifier 609 to a nominal DC operating point. Hence, the preamplifier 609 may cease to function as intended, i.e. according to prescribed specifications, for a prolonged period of time unless precautions as described below are taken. In the present embodiment, NMOS transistors $M_{12}$-$M_{1m}$ are set to their conducting state, i.e. on-state, by a controller (not shown) during start-up of the microphone amplification circuit 600. Thereby, each of the cascaded semiconductor diodes $D_{12}$-$D_{1m}$ becomes essentially bypassed by a low on-resistance of the associated cross-coupled NMOS transistor except for diode $D_{11}$. The latter diode cannot be bypassed because a parasitic diode of such NMOS transistor would short circuit the cascaded semiconductor diodes $D_{21}$-$D_{2m}$. Nevertheless, a substantial temporary decrease of impedance of the signal limiting network 607 is obtained when the NMOS transistors $M_{12}$-$M_{1m}$ are set to their respective conducting states. These conducting states create a lower impedance path from the input IN of the preamplifier 609 to ground such that the preamplifier input is fixed at, or close to, ground level, or another well-defined electric potential, during start-up of the microphone amplification circuit 600. The controller can control on-states and off-states of the NMOS transistors $M_{12}$-$M_{1m}$ by adjusting a gate control voltage on the joint control terminal R. The controller preferably detects when start-up is finalized and turns the NMOS transistors $M_{12}$-$M_{1m}$ to their respective non-conducting states or off-states in response thereto. In this manner, the temporary bypassing of the cascaded semiconductor diodes $D_{12}$-$D_{1m}$ is terminated and normal operation of the preamplifier 609 is resumed because the NMOS transistors $M_{12}$-$M_{1m}$ are switched to respective high-impedance off-states. The skilled person will understand that switches $M_{12}$-$M_{1m}$ may be controlled with a shared control signal R as well as an independent control signal for each switch $M_{12}$-$M_{1m}$, respectively.

FIG. 6b) is a vertical cross-sectional view through a semiconductor design of a combined semiconductor diode, such as $D_{13}$, and its corresponding NMOS based bypass transistor switch such as NMOS transistors $M_{13}$ utilized in the present microphone amplification circuit 600 in accordance with the schematic circuit diagram in FIG. 6a). The semiconductor diode $D_{13}$ is arranged inside a P-well 628 (P−) which is surrounded by a N-well, N−. The N-well is arranged in a P-type semiconductor substrate, P−. A field oxide layer 611 is deposited on top of an upper surface of the P− substrate in which the semiconductor diode $D_{31}$ is embedded by appropriate semiconductor process steps. The semiconductor diode $D_{13}$ is schematically indicated by a black diode symbol interconnecting the P− well 628 with a P+ anode diffusion 621 and an adjacently arranged cathode or second N+ diffusion 623 of the semiconductor diode $D_{13}$. The P− well with P+ anode diffusion 621 is electrically connected to a contact 613 and the cathode N+ diffusion 623 is electrically connected to another contact 615 such that the anode and cathode can be electrically coupled to other components of the limiting network 607 through appropriate wiring routing deposited on the upper surface of the semiconductor die or substrate P−. The semiconductor diode $D_{13}$ further comprises another P+ diffusion 625 with an associated electrical contact member 617 which in combination provides a substrate ground connection for the P− substrate similar to the design depicted in FIG. 2b) above. The N-well diffusion, N−, further surrounds a second N+ diffusion 627 which is arranged outside the P-well 628. Parasitic diodes similar to the parasitic diodes described in the layout depicted on FIG. 3b) are formed but these have been left out for simplicity. The second N+ diffusion 627 comprises an electrical contact member 619 which preferably is decoupled or unconnected (floating) to the microphone amplification circuit 600. This semiconductor design or structure of diode $D_{13}$ is largely identical to the diode structure of the semiconductor diode $D_{11}$ previously described in connection with the first embodiment. However, the present semiconductor design of the diode $D_{13}$ comprises a third N+ diffusion 631 which forms a source terminal of the NMOS transistor $M_{13}$. The third N+ diffusion 631 is electrically connected to separate contact 629 such that the source terminal can be electrically coupled to other components of the limiting network 607. A drain terminal of the NMOS transistors $M_{13}$ is formed by the existing cathode N+ diffusion 623 of the semiconductor diode $D_{13}$. A gate structure 603 of the NMOS transistor $M_{13}$ is formed by depositing a gate oxide in-between the electrical contacts 629, 615 of the source and drain diffusions of $M_{13}$. Hence, a very compact layout of the semiconductor diode $D_{13}$ and its associated cross coupled bypass switch in form of NMOS transistors $M_{13}$ has been achieved such that die area consumption is minimized and manufacturing costs for the microphone amplification circuit 600 lowered.

Figure 7:
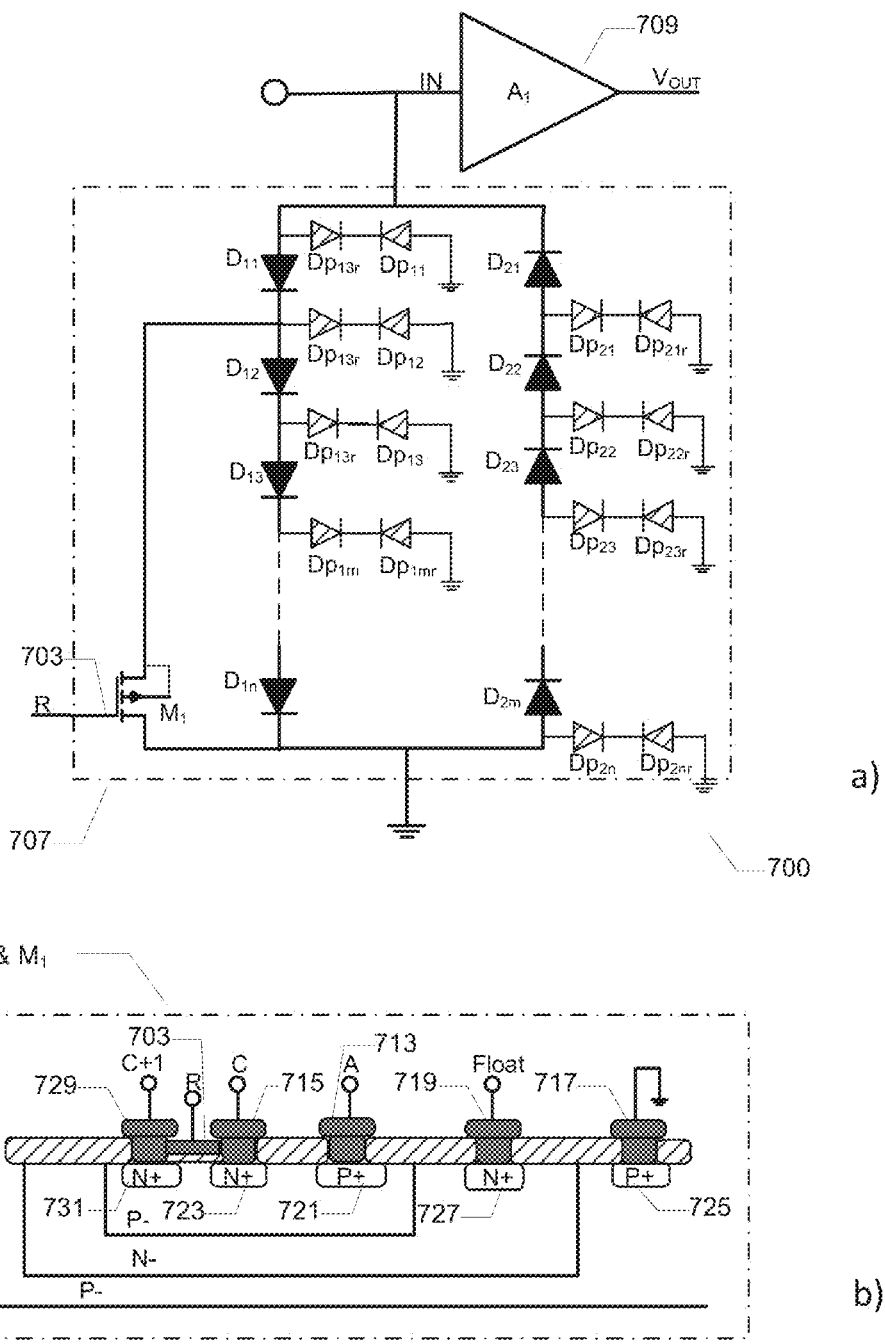
FIG. 7b) is a substrate vertical cross-sectional view through a single combined diode and MOS transistor structure of the cascaded semiconductor diodes of the input signal limiting network in accordance with the fifth embodiment of the invention.

FIG. 7a) is a simplified schematic circuit diagram of a microphone amplification circuit 700 with a signal limiting network 707 in accordance with a fifth embodiment of the present invention. The skilled person will understand that electrical characteristic of the preamplifier 709 may be similar to those of the preamplifier 209 discussed above. The characteristics and functionality of the signal limiting network 607 discussed above in connection with the microphone amplification circuit 600 of the fourth embodiment of the invention also applies to the present embodiment. However, the plurality of semiconductor switches coupled across respective ones of the plurality of cascaded semiconductor diodes $D_{12}$-$D_{1m}$ of the first leg in the fourth embodiment have been replaced by a single semiconductor switch comprising NMOS transistor $M_1$ in the present embodiment of the invention. The NMOS transistor $M_1$ is cross-coupled across the chain of semiconductor diodes $D_{12}$-$D_{1m}$ to bypass or short circuit these as described above in connection with the fourth embodiment. The use of a single cross-coupled single semiconductor switch in accordance with the present embodiment can save die area and simplify the circuit layout of the signal limiting network 707 compared to the fourth embodiment discussed above. However, the single NMOS transistor $M_1$ must now be capable of withstanding a larger drain to source voltage than each of the NMOS transistors $M_1$-$M_n$ of the fourth embodiment. This may however be feasible if a break down drain-source voltage of the single NMOS transistor $M_1$ is larger than the peak input signal voltage at the preamplifier input.

The semiconductor layout or design of the combined semiconductor diode $D_{1n}$ and the associated NMOS cross-coupled transistor $M_1$ is illustrated in a vertical cross-sectional view in FIG. 7b). The skilled person will notice that this semiconductor layout is identical to the layout depicted above on FIG. 6b). Corresponding features in these figures have been supplied with corresponding reference numerals to ease comparison. The skilled person will understand that the NMOS transistor switches, as described above in connection with the fourth and fifth embodiments of the present invention may be also utilized in conjunction with the signal limiting networks as described in the second and third embodiment of the present invention.

The invention claimed is:

1. An integrated amplification circuit for a transducer signal comprising:
   semiconductor substrate comprising a first polarity semiconductor material, said semiconductor substrate further comprising:
   a preamplifier comprising an input for receipt of the transducer signal,
   a signal limiting network comprising first and second parallel legs coupled between the input of the preamplifier and a first predetermined electric potential of the integrated amplification circuit;
   the first leg comprising a plurality of cascaded semiconductor diodes coupled to conduct current in a first direction through the limiting network,
   the second leg comprising a plurality of cascaded semiconductor diodes coupled to conduct current in a second direction through the limiting network;
   a current blocking member configured to break a parasitic current path between an anode or a cathode of a semiconductor diode of the first leg or the second leg and the semiconductor substrate.

2. An integrated amplification circuit according to claim 1, wherein each semiconductor diode of at least one of the first leg and the second leg comprises:
   a current blocking member configured to break a parasitic current path between one of an anode or a cathode of the semiconductor diode and the semiconductor substrate.

3. An integrated amplification circuit according to claim 1, wherein the semiconductor diode of one of the first leg or the second leg comprises:
   a first well diffusion of the first polarity forming part of one of an anode or cathode terminal of the semiconductor diode and surrounding a first diffusion of a second polarity forming an opposite terminal of the semiconductor diode,
   a second well diffusion of the second polarity surrounding the first well-diffusion and further surrounding a second diffusion of the second polarity arranged outside the first well diffusion to form the current blocking member,
   a first diffusion of the first polarity arranged in the semiconductor substrate outside the second well-diffusion.

4. An integrated amplification circuit according to claim 2, wherein each semiconductor diode of the first leg and each semiconductor diode of the second leg comprises:
- a first well diffusion of the first polarity forming part of one of an anode or cathode terminal of the semiconductor diode and surrounding a first diffusion of a second polarity forming an opposite terminal of the semiconductor diode,
- a second well diffusion of the second polarity surrounding the first well-diffusion and further surrounding a second diffusion of the second polarity arranged outside the first well diffusion to form the current blocking member,
- a first diffusion of the first polarity arranged in the semiconductor substrate outside the second well-diffusion.

5. An integrated amplification circuit according to claim 3, wherein one of the semiconductor diode of the first leg or semiconductor diode of the second leg comprises a second diffusion of the first polarity arranged inside the first well diffusion of the first polarity.

6. An integrated amplification circuit according to claim 2, wherein each semiconductor diode of the first leg comprises:
- a first well diffusion of the first polarity forming part of one of an anode or cathode terminal of the semiconductor diode and surrounding a first diffusion of a second polarity forming an opposite terminal of the semiconductor diode,
- a second well diffusion of the second polarity surrounding the first well-diffusion and further surrounding a second diffusion of the second polarity arranged outside the first well diffusion to form the current blocking member,
- said second well diffusion being electrically connected to a predetermined electrical potential of the integrated amplification circuit through the second diffusion of the second polarity,
- a first diffusion of the first polarity arranged in the semiconductor substrate outside the second well-diffusion; and wherein each semiconductor diode of the second leg comprises:
- a third well diffusion of the second polarity arranged in the semiconductor substrate and forming part of an anode or cathode terminal of the semiconductor diode,
- the third well diffusion surrounding a second diffusion of the first polarity forming an opposite terminal of the semiconductor diode.

7. An integrated amplification circuit according to claim 6, wherein the first diffusion of the first polarity is arranged in-between the second well diffusion of the second polarity and the third well diffusion of the second polarity; and the first diffusion of the first polarity being electrically coupled to a second predetermined electric potential of the integrated amplification circuit.

8. An integrated amplification circuit according to claim 2, wherein the first polarity is p-type and second polarity is n-type; or
the first polarity is n-type and second polarity is p-type.

9. An integrated amplification circuit according to claim 2, wherein the second diffusion of the second polarity (F) is electrically decoupled from the integrated amplification circuit or electrically connected to a third predetermined electrical potential.

10. An integrated amplification circuit according to claim 3, wherein a doping of the second diffusion of the second polarity (F) is higher than a doping of the second well diffusion of the second polarity.

11. An integrated amplification circuit according to claim 3, wherein the second diffusion of the first polarity (GND) is electrically coupled to a ground node of the integrated amplification circuit through an electrical contact.

12. An integrated amplification circuit according to claim 1, wherein the first leg comprises two or more cascaded semiconductor diodes and the second leg comprises two or more cascaded semiconductor diodes.

13. An integrated amplification circuit according to claim 12, wherein the first leg comprises the same number of cascaded semiconductor diodes as the second leg.

14. An integrated amplification circuit according to claim 3, comprising a MOS transistor coupled across one or more of the plurality of cascaded semiconductor diodes of one of the first leg or the second leg.

15. An integrated amplification circuit according to claim 14, comprising a plurality of MOS transistors coupled across respective semiconductor diodes of one of the first leg or the second leg.

16. An integrated amplification circuit according to claim 14, wherein each MOS transistor comprises:
- a third diffusion of the second polarity arranged within the first well to provide a first drain or source terminal of the MOS transistor,
- a gate terminal formed above the first well in-between the third diffusion of the second polarity and the first diffusion of the second polarity;
- wherein the first diffusion of the second polarity forms both a second drain or source terminal of the MOS transistor and an anode or cathode terminal of a first semiconductor diode of the plurality of cascaded semiconductor diodes.

17. An integrated amplification circuit according to claim 16, wherein the third diffusion of the second polarity is electrically connected to one of an anode or cathode terminal of one of the first semiconductor diode or another semiconductor diode of the plurality of cascaded semiconductor diodes of the same leg as the first semiconductor diode.

18. An integrated amplification circuit according to claim 3, wherein at least one of the first diffusion of the second polarity, the second diffusion of the second polarity, the third diffusion of the second polarity, the first diffusion of the first polarity, or the third diffusion of the first polarity comprises an electrical contact member connected thereto.

19. An integrated amplification circuit according to claim 2, wherein the semiconductor diode of one of the first leg or the second leg comprises a diode selected from a group of a diode-coupled bipolar transistor, a diode-coupled MOS transistor, and a diode.

20. An integrated amplification circuit according to claim 1, wherein one or more semiconductor diode(s) of one of the first leg or the second leg comprises:
- a thick oxide layer deposited on an upper surface of the semiconductor substrate diffusion forming the current blocking member,
- a first poly-silicon member of a first polarity and second poly-silicon member of a second polarity arranged in electrical contact on top of the thick oxide layer opposite to the semiconductor substrate.

21. An integrated amplification circuit according to claim 20, wherein the first poly-silicon member and the second poly-silicon member are adjacently arranged on the top of the thick oxide layer and abutted to create the electrical contact.

22. An integrated amplification circuit according to claim 20, comprising a third poly-silicon member of one of the first polarity, of the second polarity, or without polarity, the third poly-silicon member arranged in-between, and in abutment with, the first poly-silicon member and the second poly-silicon member to create the electrical contact;

the third poly-silicon member having a lower doping than a doping of one of the first or the second poly-silicon member.

23. An integrated amplification circuit according to claim 3, wherein a semiconductor diode of the other leg of one of the first or second legs comprises:
- a thick oxide layer deposited on an upper surface of the semiconductor substrate diffusion forming the current blocking member,
- a first poly-silicon member of a first polarity and second poly-silicon member of a second polarity arranged in electrical contact on top of the thick oxide layer opposite to the semiconductor substrate.

24. An integrated amplification circuit according to claim 1, wherein the signal limiting network is DC coupled to the input of the preamplifier to set a DC bias point of the preamplifier.

25. An integrated amplification circuit according to claim 1, comprising:
- a DC bias voltage generator for supplying a DC bias voltage at a first externally accessible terminal.

26. A capacitive or condenser microphone assembly comprising:
- a capacitive transducer element having a back plate and a diaphragm arranged in a spaced relationship thereto, the diaphragm being displaceable relative to the back plate in response to sound;
- an integrated amplification circuit according to claim 1 coupled to the capacitive transducer element such that at least one of the diaphragm and the back plate is electrically coupled to the input of the preamplifier to supply a microphone signal to the preamplifier.

27. A capacitive or condenser microphone assembly according to claim 26, comprising a miniature MEMS condenser capsule enclosing the back plate and diaphragm and mounted on one of a carrier or substrate for the assembly.

28. A capacitive or condenser microphone assembly according to claim 27, comprising a miniature MEMS condenser capsule enclosing the back plate and diaphragm and being integrally formed with the integrated amplification circuit on the semiconductor substrate.

* * * * *